(12) United States Patent
Kim et al.

(10) Patent No.: US 9,424,989 B2
(45) Date of Patent: Aug. 23, 2016

(54) EMBEDDED MULTILAYER CERAMIC ELECTRONIC COMPONENT AND PRINTED CIRCUIT BOARD HAVING THE SAME

(71) Applicant: SAMSUNG ELECTRO-MECHANICS CO., LTD., Suwon, Gyunggi-do (KR)

(72) Inventors: Hye Seong Kim, Gyunggi-do (KR); Eun Hyuk Chae, Gyunggi-do (KR); Hai Joon Lee, Gyunggi-do (KR); Young Don Choi, Gyunggi-do (KR); Jin Sung Kim, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 25 days.

(21) Appl. No.: 14/146,590

(22) Filed: Jan. 2, 2014

(65) Prior Publication Data

US 2015/0041196 A1 Feb. 12, 2015

(30) Foreign Application Priority Data

Aug. 9, 2013 (KR) .......................... 10-2013-0094688

(51) Int. Cl.
*H01G 4/30* (2006.01)
*H01G 4/232* (2006.01)
(Continued)

(52) U.S. Cl.
CPC ............... *H01G 4/30* (2013.01); *H01G 4/2325* (2013.01); *H01G 4/12* (2013.01); *H05K 1/185* (2013.01); *H05K 2201/10015* (2013.01); *H05K 2201/10636* (2013.01); *Y02P 70/611* (2015.11)

(58) Field of Classification Search
CPC ............................................. H01G 4/00–4/40
See application file for complete search history.

(56) References Cited

U.S. PATENT DOCUMENTS 6,381,117 B1 * 4/2002 Nakagawa ............... H01G 2/14
361/301.4
7,131,174 B2 * 11/2006 Kobayashi et al. .......... 29/25.42
(Continued)

FOREIGN PATENT DOCUMENTS

JP 4-94106 A 3/1992
JP 08-255702 1/1996
(Continued)

OTHER PUBLICATIONS

Korean Office Action issued in Korean Application No. 10-2013-0094688 dated Jul. 7, 2014, with English Translation.
(Continued)

*Primary Examiner* — Jeremy C Norris
*Assistant Examiner* — Muhammed Azam
(74) *Attorney, Agent, or Firm* — McDermott Will & Emery LLP

(57) ABSTRACT

An embedded multilayer ceramic electronic component includes a ceramic body including a dielectric layer and having first and second main surfaces, first and second side surfaces, and first and second end surfaces, first and second internal electrodes, and first and second external electrodes, wherein the first external electrode includes a first base electrode electrically connected to the first internal electrode, a first intermediate layer, and a first terminal electrode, the second external electrode includes a second base electrode electrically connected to the second internal electrode, a second intermediate layer, and a second terminal electrode, the first and second base electrodes include a first conductive metal and glass, and the first and second terminal electrodes are formed of a second conductive metal.

4 Claims, 3 Drawing Sheets

(51) Int. Cl.
*H01G 4/12* (2006.01)
*H05K 1/18* (2006.01)

(56) References Cited

U.S. PATENT DOCUMENTS

| | | | |
|---|---|---|---|
| 7,397,649 B2* | 7/2008 | Muto et al. | 361/321.4 |
| 7,710,712 B2* | 5/2010 | Takeoka | 361/321.2 |
| 7,719,819 B2* | 5/2010 | Motoki et al. | 361/321.2 |
| 2002/0046861 A1* | 4/2002 | Yokoyama | H01C 1/148 174/565 |
| 2002/0117743 A1* | 8/2002 | Nakatani et al. | 257/687 |
| 2004/0090732 A1* | 5/2004 | Ritter | C23C 18/1605 361/306.1 |
| 2005/0248908 A1 | 11/2005 | Dreezen et al. | |
| 2006/0039097 A1* | 2/2006 | Satou | H01G 4/01 361/303 |
| 2006/0133057 A1* | 6/2006 | McGregor et al. | 361/763 |
| 2007/0009719 A1* | 1/2007 | Naito | H01G 4/1236 428/210 |
| 2007/0014075 A1* | 1/2007 | Ritter | H01G 4/232 361/306.3 |
| 2008/0081200 A1* | 4/2008 | Katsube | H01G 4/2325 428/457 |
| 2010/0155124 A1 | 6/2010 | Kawamura et al. | |
| 2010/0206624 A1* | 8/2010 | Feichtinger | 174/260 |
| 2011/0193448 A1 | 8/2011 | Saruban et al. | |
| 2012/0231262 A1* | 9/2012 | Sone et al. | 428/328 |
| 2014/0174800 A1* | 6/2014 | Chang | H05K 1/185 174/257 |
| 2014/0182907 A1* | 7/2014 | Lee | H05K 1/162 174/258 |
| 2015/0021077 A1* | 1/2015 | Chae | H01G 4/30 174/260 |

FOREIGN PATENT DOCUMENTS

| | | |
|---|---|---|
| JP | 2002-008938 A | 1/2002 |
| JP | 2002-111219 A | 4/2002 |
| JP | 2003-243249 A | 8/2003 |
| JP | 2009-146732 A | 7/2009 |
| JP | 2010-123865 A | 6/2010 |
| JP | 2010-153767 A | 7/2010 |
| KR | 10-2006-0047733 A | 5/2006 |
| KR | 10-2008-0010452 A | 1/2008 |
| KR | 10-2011-0091449 A | 8/2011 |

OTHER PUBLICATIONS

Japanese Office Action issued in Application No. 2013-269554 dated Jun. 23, 2015.

* cited by examiner

EMBEDDED MULTILAYER CERAMIC ELECTRONIC COMPONENT AND PRINTED CIRCUIT BOARD HAVING THE SAME

CROSS-REFERENCE TO RELATED APPLICATION

This application claims the benefit of Korean Patent Application No. 10-2013-0094688 filed on Aug. 9, 2013, with the Korean Intellectual Property Office, the disclosure of which is incorporated herein by reference.

BACKGROUND

The present disclosure relates to an embedded multilayer ceramic electronic component and a printed circuit board having the same.

In accordance with high densification and high integration of electronic circuits, mounting spaces in which passive devices are mounted on printed circuit boards are insufficient, and in order to solve this problem, efforts to implement components able to be embedded in boards, for example, embedded devices, have been attempted. Particularly, various methods for embedding multilayer ceramic electronic components used as capacitive components in the boards have been suggested.

Examples of methods of embedding a multilayer ceramic electronic component in a board include a method using a board material itself as a dielectric material for a multilayer ceramic electronic component and using a copper wiring or the like as an electrode for a multilayer ceramic electronic component. In addition, examples of another method for implementing an embedded multilayer ceramic electronic component include a method of forming an embedded multilayer ceramic electronic component by forming a polymer sheet having a high dielectric constant or a thin dielectric layer in a board, a method of embedding a multilayer ceramic electronic component in a board, and the like.

In general, multilayer ceramic electronic components include a plurality of dielectric layers formed of a ceramic material and internal electrodes interposed between the plurality of dielectric layers. By disposing the above-mentioned multilayer ceramic electronic components in the boards, the embedded multilayer ceramic electronic components having high capacitance may be implemented.

Meanwhile, since the embedded multilayer ceramic electronic components should be embedded in core portions within boards, nickel and tin (Ni/Sn) plated layers are not necessary to be formed on external electrodes, unlike general multilayer ceramic electronic components mounted on surfaces of boards.

For example, since external electrodes of embedded multilayer ceramic electronic components are electrically connected to circuits inboards through vias of which a material is copper (Cu), copper (Cu) layers are required to be formed on the external electrodes, instead of nickel and tin (Ni/Sn) layers.

In general, external electrodes are also formed of copper (Cu) as a main component thereof, but contain glass, such that a component contained in glass absorbs a laser beam at the time of performing a laser process in forming vias in boards, whereby processing depth of vias may not be able to be adjusted.

Due to the reason as above, copper (Cu) plated layers are separately formed on external electrodes of embedded multilayer ceramic electronic components.

However, since copper (Cu) plated layers are separately formed as described above, a problem in which reliability may be deteriorated due to infiltration of a plating solution may occur. Accordingly, a solution to such a problem remains required.

RELATED ART DOCUMENT

Korean Patent Laid-Open Publication No. 10-2006-0047733

SUMMARY

An aspect of the present disclosure may provide an embedded multilayer ceramic electronic component and a printed circuit board having the embedded multilayer ceramic electronic component.

According to an aspect of the present disclosure, an embedded multilayer ceramic electronic component may include: a ceramic body including a dielectric layer and having first and second main surfaces opposing each other, first and second side surfaces opposing each other, and first and second end surfaces opposing each other; a first internal electrode and a second internal electrode formed to be alternately exposed through both end surfaces of the ceramic body, having the dielectric layer interposed therebetween; and first and second external electrodes formed on both end surfaces of the ceramic body, wherein the first external electrode includes a first base electrode electrically connected to the first internal electrode, a first intermediate layer formed on the first base electrode and formed of nickel (Ni), and a first terminal electrode formed on the first intermediate layer, the second external electrode includes a second base electrode electrically connected to the second internal electrode, a second intermediate layer formed on the second base electrode and formed of nickel (Ni), and a second terminal electrode formed on the second intermediate layer, the first and second base electrodes include a first conductive metal and glass, and the first and second terminal electrodes are formed of a second conductive metal.

The first and second intermediate layers may have a thickness of 0.5 μm to 10 μm.

The first conductive metal may be at least one selected from a group consisting of copper (Cu), silver (Ag), nickel (Ni), and alloys thereof.

The second conductive metal may be copper (Cu).

The first and second intermediate layers may be formed by plating and the first and second terminal electrodes may be formed by plating.

The ceramic body may have a thickness satisfying 250 μm or less.

According to another aspect of the present disclosure, a printed circuit board having an embedded multilayer ceramic electronic component may include: an insulation substrate; and an embedded multilayer ceramic electronic component including a ceramic body including a dielectric layer and having first and second main surfaces opposing each other, first and second side surfaces opposing each other, and first and second end surfaces opposing each other; a first internal electrode and a second internal electrode formed to be alternately exposed through both end surfaces of the ceramic body, having the dielectric layer interposed therebetween; and first and second external electrodes formed on both end surfaces of the ceramic body, the first external electrode including a first base electrode electrically connected to the first internal electrode, a first intermediate layer formed on the first base electrode and formed of nickel (Ni), and a first terminal electrode formed on the first intermediate layer, the second external electrode including a second base electrode electrically connected to the second internal electrode, a second intermediate layer formed on the second base electrode and formed of nickel (Ni), and a second terminal electrode formed on the second intermediate layer, the first and second base electrodes including a first conductive metal and glass, and the first and second terminal electrodes being formed of a second conductive metal, wherein the embedded multilayer ceramic electronic component is embedded in the insulation substrate.

The first and second intermediate layers may have a thickness of 0.5 μm to 10 μm.

The first conductive metal may be at least one selected from a group consisting of copper (Cu), silver (Ag), nickel (Ni), and alloys thereof.

The second conductive metal may be copper (Cu).

The first and second intermediate layers may be formed by plating and the first and second terminal electrodes may be formed by plating.

The ceramic body may have a thickness satisfying 250 μm or less.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
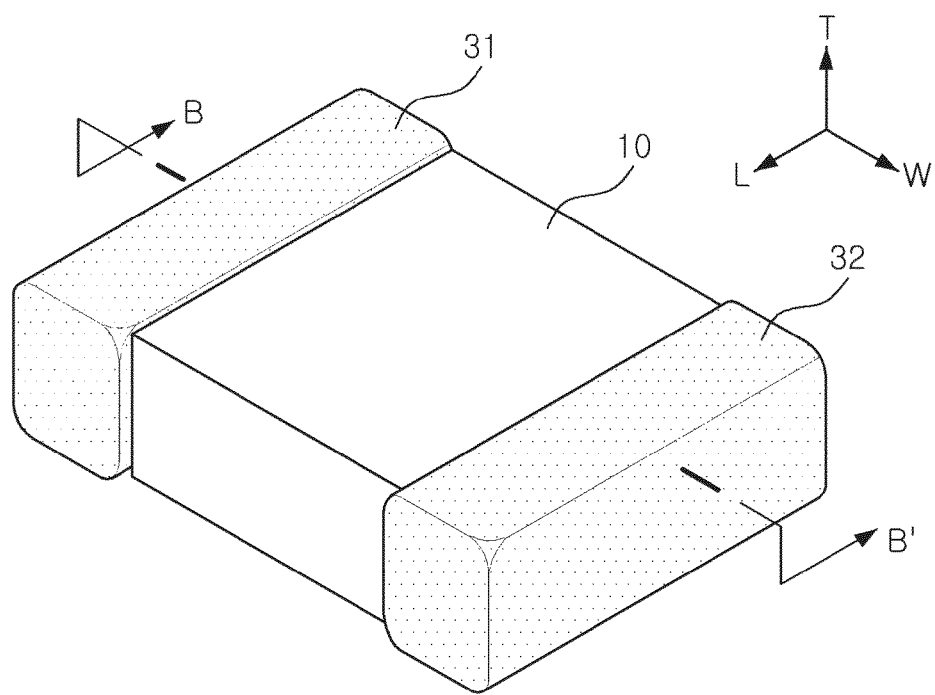
FIG. 1 is a perspective view showing an embedded multilayer ceramic electronic component according to an exemplary embodiment of the present disclosure.

Embodiments of the inventive concept will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Embedded Multilayer Ceramic Electronic Component

Exemplary embodiments of the present disclosure will now be described in detail with reference to the accompanying drawings.

FIG. 1 is a perspective view showing an embedded multilayer ceramic electronic component according to an exemplary embodiment of the present disclosure.

Figure 2:
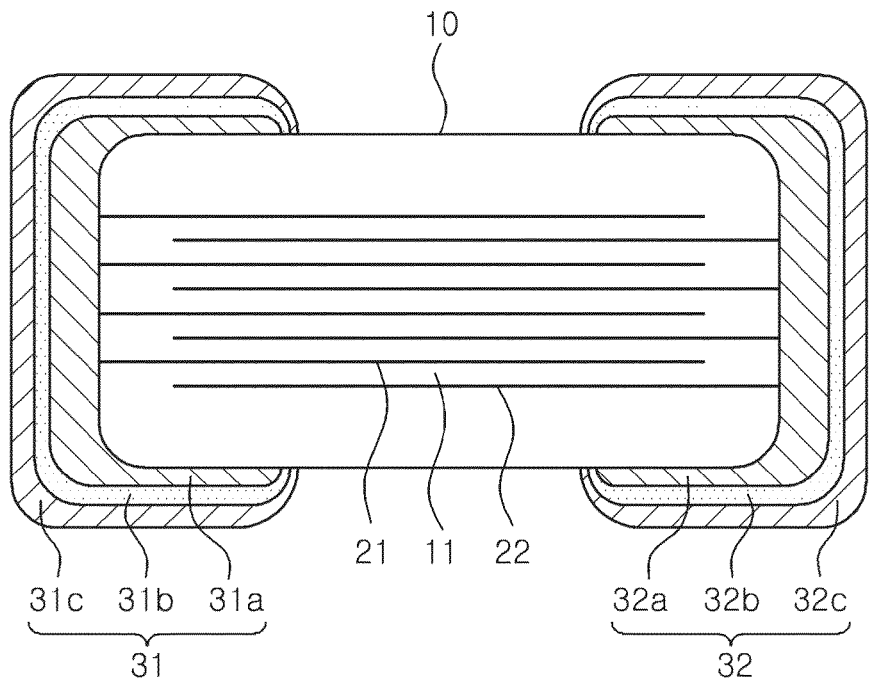
FIG. 2 is a cross-sectional view taken along line B-B' of FIG. 1.

FIG. 2 is a cross-sectional view taken along line B-B' of FIG. 1.

Figure 3:
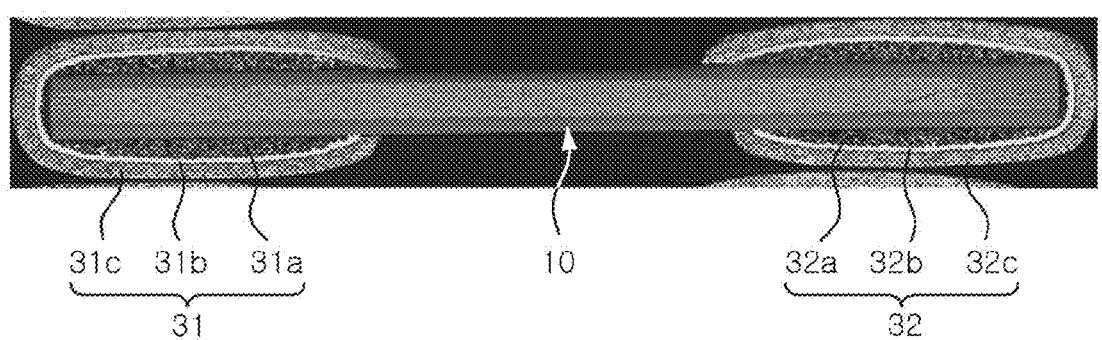
FIG. 3 is a scanned electron microscope photograph showing a cross section of the embedded multilayer ceramic electronic component according to the exemplary embodiment of the present disclosure.

FIG. 3 is a scanned electron microscope photograph showing a cross section of the embedded multilayer ceramic electronic component according to the exemplary embodiment of the present disclosure.

Referring to FIGS. 1 through 3, an embedded multilayer ceramic electronic component according to an exemplary embodiment of the present disclosure may include a ceramic body 10 including a dielectric layer 11 and having first and second main surfaces opposing each other, first and second side surfaces opposing each other, and first and second end surfaces opposing each other; a first internal electrode 21 and a second internal electrode 22 formed to be alternately exposed through both end surfaces of the ceramic body 10, having the dielectric layer 11 therebetween; and first and second external electrodes 31 and 32 formed on both end surfaces of the ceramic body 10, wherein the first external electrode 31 includes a first base electrode 31a electrically connected to the first internal electrode 21, a first intermediate layer 31b formed on the first base electrode 31a and formed of nickel (Ni), and a first terminal electrode 31c formed on the first intermediate layer 31b, the second external electrode 32 includes a second base electrode 32a electrically connected to the second internal electrode 22, a second intermediate layer 32b formed on the second base electrode 32a and formed of nickel (Ni), and a second terminal electrode 32c formed on the second intermediate layer 32b, the first and second base electrodes 31a and 32a include a first conductive metal and glass, and the first and second terminal electrodes 31c and 32c may be formed of a second conductive metal.

Hereinafter, a multilayer ceramic electronic component according to an exemplary embodiment of the present disclosure will be described. Particularly, a multilayer ceramic capacitor will be described. However, the present disclosure is not limited thereto.

In the multilayer ceramic capacitor according to the exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' is the same as a direction in which dielectric layers are stacked, for example, a 'stacking direction'.

In the exemplary embodiment of the present disclosure, a shape of the ceramic body 10 is not particularly limited, but may be a hexahedral shape as shown FIG. 1.

According to the exemplary embodiment of the present disclosure, the ceramic body 10 may have the first and second main surfaces opposing each other, the first and second side surfaces opposing each other, and the first and second end surfaces opposing each other, where the first and second main surfaces may be represented as an upper surface and a lower surface of the ceramic body 10.

According to the exemplary embodiment of the present disclosure, a raw material forming the dielectric layer 11 is not particularly limited as long as sufficient capacitance may be obtained therefrom, and may be, for example, a barium titanate ($BaTiO_3$) powder.

In a material forming the dielectric layer 11, various ceramic additives, organic solvents, plasticizers, binders, dispersing agents, and the like may be added to a powder such as a barium titanate ($BaTiO_3$) powder, or the like, as needed, according to an embodiment of the present disclosure.

An average particle diameter of a ceramic powder used for forming the dielectric layer 11 is not particularly limited, may be adjusted to implement an embodiment of the present disclosure, and may be adjusted to, for example, 400 nm or less.

The first internal electrode 21 and the second internal electrode 22 may be formed to be alternately exposed through both end surfaces of the ceramic body 10, having the dielectric layer 11 interposed therebetween.

A material forming the first and second internal electrodes 21 and 22 is not particularly limited, but may be formed using a conductive paste formed of, for example, at least one of noble metal materials such as palladium (Pd), a palladium-silver (Pd—Ag) alloy, and the like, nickel (Ni), and copper (Cu).

According to the exemplary embodiment of the present disclosure, the ceramic body 10 may have the first and second external electrodes 31 and 32 formed on both end surfaces thereof.

The first external electrode 31 may include the first base electrode 31a electrically connected to the first internal electrode 21, the first intermediate layer 31b formed on the first base electrode 31a and formed of nickel (Ni), and the first terminal electrode 31c formed on the first intermediate layer 31b.

In addition, the second external electrode 32 may include the second base electrode 32a electrically connected to the second internal electrode 22, the second intermediate layer 32b formed on the second base electrode 32a and formed of nickel (Ni), and the second terminal electrode 32c formed on the second intermediate layer 32b.

Hereinafter, structures of the first and second external electrodes 31 and 32 will be described in further detail.

The first and second base electrodes 31a and 32a may include the first conducive metal and glass.

In order to form capacitance, the first and second external electrodes 31 and 32 may be formed on both end surfaces of the ceramic body 10, and the first and second base electrodes 31a and 32a included in the first and second external electrodes 31 and 32 may be electrically connected to the first and second internal electrodes 21 and 22.

The first and second base electrodes 31a and 32a may be formed of the conductive material as the first and second internal electrodes 21 and 22, but are not limited thereto, and may be formed of at least one first conductive metal selected from a group consisting of, for example, copper (Cu), silver (Ag), nickel (Ni), and alloys thereof.

The first and second base electrodes 31a and 32a may be formed by applying a conductive paste prepared by adding glass frit to the first conductive metal powder to then be fired.

According to the exemplary embodiment of the present disclosure, the first and second external electrodes 31 and 32 may include the first and second intermediate layers 31b and 32b formed on the first and second base electrodes 31a and 32a and formed of nickel (Ni).

In general, since the embedded multilayer ceramic electronic component should be embedded in a core portion within the board, a nickel and tin (Ni/Sn) plated layer is not necessary to be formed on the external electrode, unlike a general multilayer ceramic electronic component mounted on a surface of the board.

For example, since the external electrode of the embedded multilayer ceramic electronic component is electrically connected to a circuit in the board through a via of which a material may be copper (Cu), a copper (Cu) layer is required to be formed on the external electrode, instead of the nickel and tin (Ni/Sn) layer.

Since the external electrode is generally formed of copper (Cu) as a main component thereof, but contains glass, a component contained in the glass absorbs a laser beam at the time of performing a laser process used for forming the via in the board, such that a processing depth of the via may not be able to be adjusted.

For this reason, the copper (Cu) plated layer has been separately formed on an external electrode of an embedded multilayer ceramic electronic component.

Due to the formation of a separate copper (Cu) plated layer, the decrease in reliability due to infiltration of a plating solution may be caused.

For example, in the forming of the copper (Cu) plated layer, a copper (Cu) plating solution may be infiltrated into the external electrode to thereby cause the occurrence of erosion on the glass, or may be infiltrated into a chip to thereby cause characteristic degradation.

According to the exemplary embodiment of the present disclosure, however, the first and second external electrodes 31 and 32 may include the first and second intermediate layers 31b and 32b formed on the first and second base electrodes 31a and 32a and formed of nickel (Ni) so as to prevent erosion of the glass due to infiltration of the copper (Cu) plating solution into the external electrode or characteristic degradation due to infiltration of the copper (Cu) plating solution into the chip.

Therefore, the embedded multilayer ceramic electronic component having excellent reliability may be implemented.

The thickness of the first and second intermediate layers 31b and 32b formed of nickel (Ni) is not particularly limited, but may be within a range of, for example, 0.5 μm to 10 μm.

The thickness of the first and second intermediate layers 31b and 32b formed of nickel (Ni) is adjusted to satisfy the range of 0.5 μm to 10 μm, such that erosion of the glass due to infiltration of the copper (Cu) plating solution into the external electrode or characteristic degradation due to infiltration of the copper (Cu) plating solution into the chip may be prevented, and the occurrence of cracks in a chip due to plating stress may be prevented, thereby improving reliability of a capacitor.

In the case in which the thickness of the first and second intermediate layers 31b and 32b formed of nickel (Ni) is less than 0.5 μm, the thickness of the first and second intermediate layers 31b and 32b is relatively thin, such that the copper (Cu) plating solution may be infiltrated into the external electrode.

Meanwhile, in the case in which the thickness of the first and second intermediate layers 31b and 32b formed of nickel (Ni) exceeds 10 μm, cracks in the chip may occur due to plating stress, thereby degrading reliability.

The first and second intermediate layers 31b and 32b may be formed by plating, but the present disclosure is not limited thereto.

According to the exemplary embodiment of the present disclosure, the first and second external electrodes 31 and 32 may include the first and second terminal electrodes 31c and 32c formed on the first and second intermediate layers 31b and 32b.

The first and second terminal electrodes 31c and 32c may be formed using the conductive paste of a second conductive metal.

The second conductive metal is not particularly limited, but may be, for example, copper (Cu).

Since the multilayer ceramic capacitor is generally mounted on a printed circuit board, a nickel and tin plated layer may be generally formed on the external electrode.

However, the multilayer ceramic capacitor according to the exemplary embodiment of the present disclosure, to be embedded in the printed circuit board, is not mounted on the board, and a circuit of the board may be electrically connected to the first external electrode 31 and the second external electrode 32 of the multilayer ceramic capacitor through a via thereof a material is copper (Cu).

Therefore, according to the exemplary embodiment of the present disclosure, the first and second terminal electrodes 31c and 32c may be formed of copper (Cu) having relatively excellent electrical connectivity with copper (Cu) which is the material of the via in the board.

The first and second terminal electrodes 31c and 32c may be formed by plating, but the present disclosure is not limited thereto.

Hereinafter, a method of manufacturing an embedded multilayer ceramic electronic component according to an exemplary embodiment of the present disclosure will be described. However, the present disclosure is not limited thereto.

A method of manufacturing an embedded multilayer ceramic electronic component according to an exemplary embodiment of the present disclosure may include first applying a slurry containing a powder such as a barium titanate ($BaTiO_3$) powder, or the like, to a carrier film to then be dried thereon so as to prepare a plurality of ceramic green sheets, thereby forming dielectric layers.

The ceramic green sheet may be fabricated by mixing a ceramic powder, a binder, and a solvent to thereby manufacture a slurry and manufacturing the slurry as a sheet having a thickness of several μm by a doctor blade method.

Then, a conductive paste for an internal electrode including 40 to 50 parts by weight of a nickel powder having an average particle size of 0.1 to 0.2 μm may be prepared.

After the conductive paste for an internal electrode is applied to the green sheet by a screen printing method to form the internal electrode, 400 to 500 layers of the green sheets having the internal electrodes formed thereon may be stacked to form the ceramic body 10.

In the multilayer ceramic capacitor according to the exemplary embodiment of the present disclosure, the first and second internal electrodes 21 and 22 may be formed to be exposed through both end surfaces of the ceramic body 10, respectively.

Next, the first base electrode and the second base electrode including a first conductive metal and the glass may be formed on ends of the ceramic body 10.

The first conductive metal is not particularly limited, but may be at least one selected from a group consisting of copper (Cu), silver (Ag), nickel (Ni), and alloys thereof.

The glass is not particularly limited, but a material having the same composition as glass used in forming an external electrode of a general multilayer ceramic capacitor may be used for the glass.

The first and second base electrodes may be formed on ends of the ceramic body, to thereby be electrically connected to the first and second internal electrodes, respectively.

Next, first and second intermediate layers formed on the first and second base electrodes and formed of nickel (Ni) may be formed.

For example, the first and second intermediate layers may be formed by plating, but a method of forming thereof is not particularly limited.

Next, first and second terminal electrodes formed on the first and second intermediate layers and formed of the second conductive metal may be formed.

The second conductive metal is not particularly limited, and, for example, may be copper (Cu).

For example, the first and second terminal electrodes may be formed by plating, but a method of forming thereof is not particularly limited.

A description of the same portions as the features of the embedded multilayer ceramic electronic component according to the foregoing exemplary embodiment of the present disclosure described above will be omitted herein.

Hereafter, although the present disclosure will be described in detail with reference to an example according to an embodiment of the present disclosure, it is not limited thereto.

In order to check moisture resistance reliability, accelerated life reliability, and whether or not cracks occur depending on the thickness of the first and second intermediate layers 31b and 32b formed of nickel (Ni), in the embedded multilayer ceramic electronic component according to the exemplary embodiment of the present disclosure, the board having the multilayer ceramic electronic component embedded therein was left under a general condition of a chip component for a mobile phone mother board, for example, at a temperature of 85° C. and a relative humidity of 85%, for thirty minutes, and each examination was performed to be examined.

Whether or not cracks occurred was determined as being good (○) in a case in which an occurrence rate thereof is less than 10% for 400 chip components and was determined as being defective (x) in a case in which the occurrence rate thereof is 10% or more.

The following table 1 illustrates moisture resistance reliability, accelerated life reliability, and whether or not cracks occurred depending on the thicknesses of first to third intermediate layers formed of nickel (Ni).

TABLE 1

| Thicknesses of first to third intermediate layers (μm) | Decision of moisture resistance reliability | Decision of accelerated life reliability | Decision of crack defects |
| --- | --- | --- | --- |
| 0.1 | x | x | ○ |
| 0.3 | x | x | ○ |
| 0.5 | ○ | ○ | ○ |
| 1.0 | ○ | ○ | ○ |
| 2.0 | ○ | ○ | ○ |
| 4.0 | ○ | ○ | ○ |
| 6.0 | ○ | ○ | ○ |
| 8.0 | ○ | ○ | ○ |
| 10.0 | ○ | ○ | ○ |
| 12.0 | ○ | ○ | x | x: defect rate of 10% or more
○: defect rate less than 10%

Referring to Table 1 as mentioned above, it may be appreciated that in the case in which the thickness of the first to third intermediate layers formed of nickel (Ni) is 0.5 μm or more to 10.0 μm or less, moisture resistance and accelerated life reliability are relatively excellent and cracks due to plating did not occur, such that the multilayer ceramic capacitor having relatively excellent reliability may be implemented.

On the other hand, it may be appreciated that in the case in which the thickness of the first to third intermediate layers formed of nickel (Ni) is less than 0.5 μm, moisture resistance and accelerated life reliability have a problem in which a plating solution is infiltrated.

In addition, it may be appreciated that in the case in which the thickness of the first to third intermediate layers formed of nickel (Ni) exceeds 10.0 μm, cracks may occur due to plating, thereby having a problem in reliability.

Printed Circuit Board Having Embedded Multilayer Ceramic Electronic Component

Figure 4:
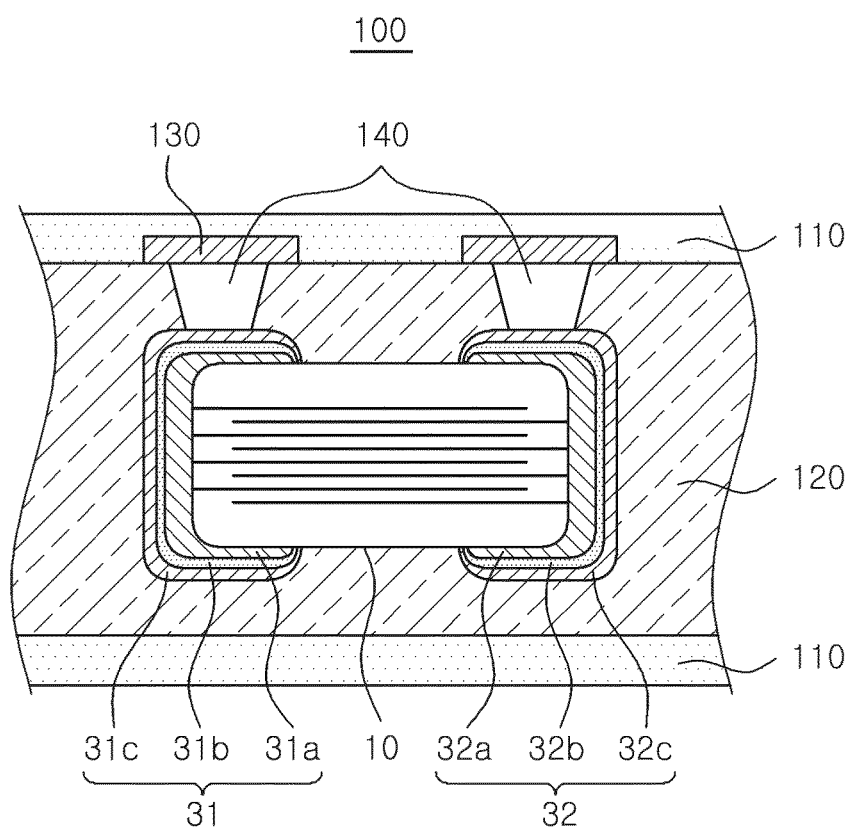
FIG. 4 is a cross-sectional view showing a printed circuit board having a multilayer ceramic electronic component embedded in a board according to an exemplary embodiment of the present disclosure.

FIG. 4 is a cross-sectional view showing a printed circuit board having an embedded multilayer ceramic electronic component according to an exemplary embodiment of the present disclosure.

Referring to FIG. 4, a printed circuit board 100 having an embedded multilayer ceramic electronic component according to an exemplary embodiment of the present disclosure may include an insulation substrate 110; and an embedded multilayer ceramic electronic component including a ceramic body 10 including a dielectric layer 11 and having first and second main surfaces opposing each other, first and second side surfaces opposing each other, and first and second end surfaces opposing each other; a first internal electrode 21 and a second internal electrode 22 formed to be alternately exposed through both end surfaces of the ceramic body 10, having the dielectric layer 11 therebetween; and first and second external electrodes 31 and 32 formed on both end surfaces of the ceramic body 10, wherein the first external electrode 31 includes a first base electrode 31a electrically connected to the first internal electrode 21, a first intermediate layer 31b formed on the first base electrode 31a and formed of nickel (Ni), and a first terminal electrode 31c formed on the first intermediate layer 31b, the second external electrode 32 includes a second base electrode 32a electrically connected to the second internal electrode 22, a second intermediate layer 32b formed on the second base electrode 32a and formed of nickel (Ni), and a second terminal electrode 32c formed on the second intermediate layer 32b, the first and second base electrodes 31a and 32a include a first conductive metal and glass, and the first and second terminal electrodes 31c and 32c are formed of a second conductive metal.

The insulation substrate 110 may have a structure in which an insulation layer 120 is formed therein, and may include a conductive pattern 130 and a conductive via hole 140 configuring interlayer circuits having various forms as shown in FIG. 4, as needed. The above-mentioned insulation substrate 110 may be the printed circuit board 100 including the multilayer ceramic electronic component therein.

After the multilayer ceramic electronic component is inserted into the printed circuit board 100, the multilayer ceramic electronic component may be subjected to the same processes as those for the printed circuit board 100 in several severe environments during post-processing such as heat treatment and the like.

Particularly, contraction and expansion of the printed circuit board 100 in the heat treatment process are directly transferred to the multilayer ceramic electronic component inserted into the printed circuit board 100 to thereby apply stress to an adhesion surface between the multilayer ceramic electronic component and the printed circuit board 100.

In the case in which stress applied to the adhesion surface between the multilayer ceramic electronic component and the printed circuit board 100 is greater than adhesion strength, a delamination defect that the adhesion surface is delaminated may occur.

Since the adhesion strength between the multilayer ceramic electronic component and the printed circuit board 100 is proportional to electrochemical adhesion and an effective surface area of the adhesion surface between the multilayer ceramic electronic component and the printed circuit board 100, surface roughness of the multilayer ceramic electronic component is controlled to improve the effective surface area of the adhesion surface between the multilayer ceramic electronic component and the printed circuit board 100, such that the occurrence of a delamination phenomenon between the multilayer ceramic electronic component and the printed circuit board 100 may be reduced.

In addition, the frequency of the occurrence of delamination on the adhesion surface with the printed circuit board 100 according to the surface roughness of the multilayer ceramic electronic component embedded in the printed circuit board 100 may be confirmed.

Features other than the above-mentioned feature are the same as those of the printed circuit board having the embedded multilayer ceramic electronic component according to the foregoing exemplary embodiment of the present disclosure described above. Therefore, a description thereof will be omitted.

According to exemplary embodiments of the present disclosure, the first and second intermediate layers formed of nickel (Ni) may be formed between the first and second base electrodes and the first and second terminal electrodes of the embedded multilayer ceramic electronic component, such that reliability degradation due to infiltration of the plating solution may be prevented.

As set forth above, according to exemplary embodiments of the present disclosure, the decrease in reliability such as the occurrence of cracks, characteristic degradation, and the like due to infiltration of a copper (Cu) plating solution may be prevented by forming an intermediate layer formed of nickel (Ni) through plating before a copper (Cu) plated layer is formed on an external electrode of an embedded multilayer ceramic electronic component.

While exemplary embodiments have been shown and described above, it will be apparent to those skilled in the art that modifications and variations could be made without departing from the spirit and scope of the present disclosure as defined by the appended claims.

What is claimed is:

1. An embedded multilayer ceramic electronic component, comprising:
    a ceramic body including a dielectric layer and having first and second main surfaces opposing each other, first and second side surfaces opposing each other, and first and second end surfaces opposing each other;
    a first internal electrode and a second internal electrode formed to be alternately exposed through both end surfaces of the ceramic body, having the dielectric layer interposed therebetween; and
    first and second external electrodes formed on both end surfaces of the ceramic body,
    wherein the first external electrode includes a first base electrode electrically connected to the first internal electrode, a first intermediate layer formed on the first base electrode and formed of nickel (Ni) by plating, and a first terminal electrode formed on the first intermediate layer and formed of copper (Cu) by plating,
    the second external electrode includes a second base electrode electrically connected to the second internal electrode, a second intermediate layer formed on the second base electrode and formed of nickel (Ni) by plating, and a second terminal electrode formed on the second intermediate layer and formed of copper (Cu) by plating,
    the first and second base electrodes include copper (Cu) and glass, and
    the first and second intermediate layers have a thickness of 0.5 μm to 10 μm.

2. The embedded multilayer ceramic electronic component of claim 1, wherein the ceramic body has a thickness satisfying 250 μm or less.

3. A printed circuit board having an embedded multilayer ceramic electronic component, the printed circuit board comprising:
    an insulation substrate; and
    an embedded multilayer ceramic electronic component including a ceramic body including a dielectric layer and having first and second main surfaces opposing each other, first and second side surfaces opposing each other, and first and second end surfaces opposing each other; a first internal electrode and a second internal electrode formed to be alternately exposed through both end surfaces of the ceramic body, having the dielectric layer interposed therebetween; and first and second external electrodes formed on both end surfaces of the ceramic body, the first external electrode including a first base electrode electrically connected to the first internal electrode, a first intermediate layer formed on the first base electrode and formed of nickel (Ni) by plating, and a first terminal electrode formed on the first intermediate layer and formed of copper (Cu) by plating, the second external electrode including a second base electrode electrically connected to the second internal electrode, a second intermediate layer formed on the second base electrode and formed of nickel (Ni) by plating, and a second terminal electrode formed on the second intermediate layer and formed of copper (Cu) by plating, the first and second base electrodes including copper (Cu) and glass, and wherein the first and second intermediate layers have a thickness of 0.5 μm to 10 μm, wherein the embedded multilayer ceramic electronic component is embedded in the insulation substrate.

4. The printed circuit board of claim 3, wherein the ceramic body has a thickness satisfying 250 μm or less.

\* \* \* \* \*